United States Patent [19]

Shen et al.

[11] Patent Number: 5,764,679
[45] Date of Patent: Jun. 9, 1998

[54] MODE LOCKED LASER WITH NEGATIVE DIFFERENTIAL RESISTANCE DIODE

[75] Inventors: Jun Shen; Wenbin Jiang, both of Phoenix, Ariz.

[73] Assignee: Motorola, Inc., Schaumburg, Ill.

[21] Appl. No.: 702,817

[22] Filed: Aug. 23, 1996

[51] Int. Cl.⁶ .................................................. H01S 3/09
[52] U.S. Cl. ...................................... 372/69; 372/18
[58] Field of Search ............................ 372/69, 18, 50; 331/37

[56] References Cited

U.S. PATENT DOCUMENTS 5,623,233  4/1997  Higgins et al. ........................ 331/37

Primary Examiner—Leon Scott, Jr.
Attorney, Agent, or Firm—Eugene A. Parsons

[57] ABSTRACT

An NDR diode (103) having a first electrical contact (105) and second electrical contact (111) is formed. A laser diode (113) having a third electrical contact and a fourth electrical contact is formed. The second electrical contact (111) of the negative differential resistance diode (103) is electrically coupled with the third.

16 Claims, 3 Drawing Sheets

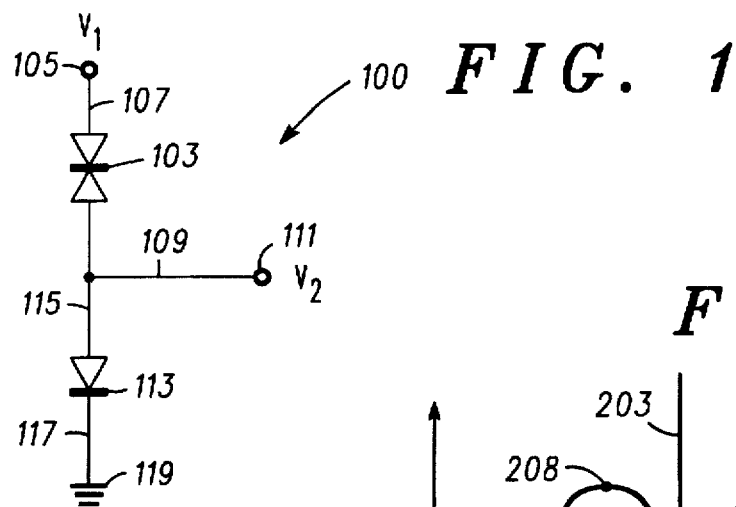
FIG. 1
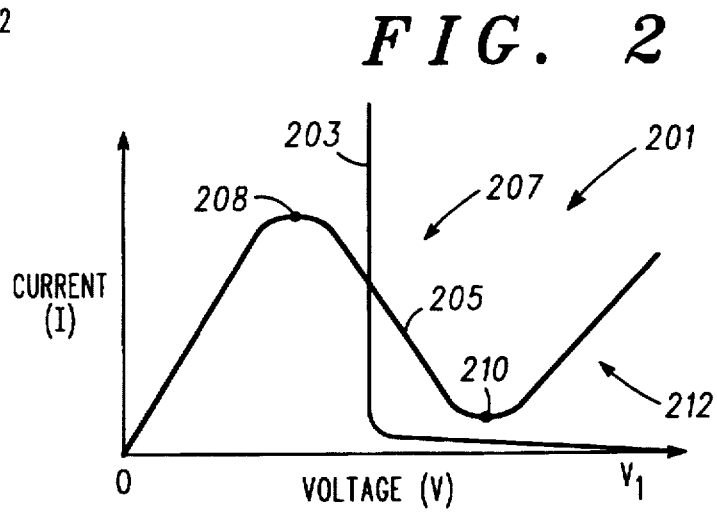
FIG. 2
FIG. 3
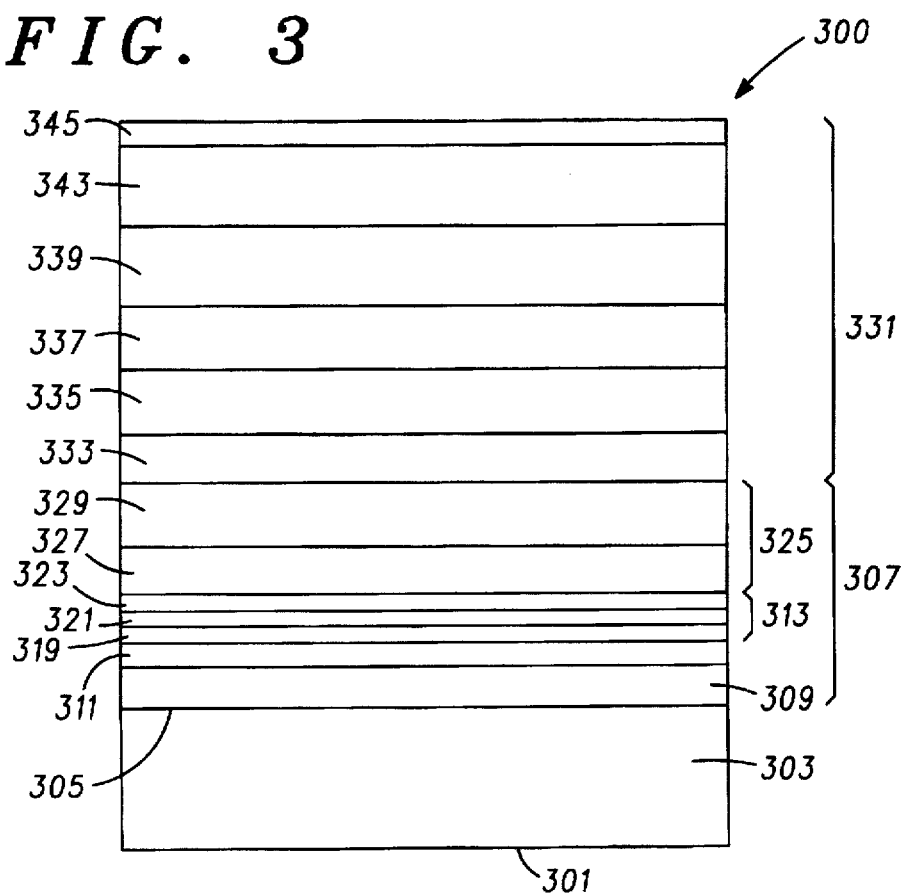

MODE LOCKED LASER WITH NEGATIVE DIFFERENTIAL RESISTANCE DIODE

FIELD OF THE INVENTION

This invention relates, in general, to optical devices and, more particularly, to mode locked semiconductor lasers.

BACKGROUND OF THE INVENTION

Conventional semiconductor laser mode locking is a convenient way of achieving picosecond or even femtosecond laser pulses for high speed telecommunication and data communications. There are three conventional methods of achieving mode locking in semiconductor lasers, such as active, passive, and hybrid mode locking.

First, the conventional active mode locking method is achieved by using an external modulation source, i.e., a modulation circuit, whose modulation has a repetition rate or frequency that matches a laser round trip cavity length. The modulation can either be an electrical pulse train biased on the laser diode or a small sinusoidal modulation current biased on the laser diode with a direct current (DC) source applied through a bias-tee, thereby generating optical pulses from the laser diode. While the optical pulses generated using this method are on the order of several picoseconds, they are not of sufficient speed for high speed data transmission.

Second, the conventional passive mode locking method is achieved by using a saturable absorber section which is fabricated adjacent to an active region of a laser. With the active region being forward DC biased and with the saturable absorption section being either unbiased or slightly reverse biased, optical pulses are generated on the order of subpicosecond range. While the passive mode locking method can generate optical pulses shorter than the active mode locking, the passive mode locking method has problems such as a large timing jitter manifested in individual optical pulses, thereby making the passive mode locking method unsuitable for high speed communication or data transmission. While the conventional active mode locking can generate pulses with a small timing jitter, the pulse width is not short enough for the high speed data transmission and communications.

Third, the conventional hybrid mode locking method is achieved by combining the active mode locking and the passive mode locking. While the hybrid mode locking method solves the problem of timing jitter while maintaining a reasonably short pulse width, the hybrid method still has significant drawbacks. For example, the external modulation source requires complicated electronic circuitry because of the high repetition rate requirement. The modulation circuit also takes up a large space in a package and makes the manufacturing more expensive, thereby making the hybrid mode locking method unsuitable for high speed data transmission and communication and for high volume manufacturing.

Thus, there is a need to provide a simplified mode locked laser that is compact, easy and less expensive to manufacture, and can operate at high speed.

It is thus a purpose of the present invention to provide a new and improved mode locked laser.

It is another purpose of the present invention to provide a new and improved mode locked laser that is compact, easy and less expensive to manufacture, and can operate at high speed.

It is still another purpose of the present invention to provide a new and improved mode locked laser that can be used as a source generator for high speed optical communications.

SUMMARY OF THE INVENTION

The above problems and others are at least partially solved and the above purposes and others are realized in a mode locked laser with a negative differential resistance diode including a negative differential resistance diode having a first electrical contact and a second electrical contact and a laser diode having a third electrical contact and a fourth electrical contact. The second electrical contact of the negative differential resistance diode is electrically coupled with the third electrical contact of the laser diode and the negative differential resistance diode and the laser diode are integrated into a single monolithic device.

Active mode locking is achieved in the integrated device when the modulation repetition rate from an electrical pulse train generated by the negative differential resistance diode matches the round trip laser cavity length. Picosecond laser pulses with a repetition rate of the electrical pulse train is therefore generated from the laser.

BRIEF DESCRIPTION OF THE DRAWINGS

Referring to the drawings:

FIG. 1 is a simplified schematic diagram of a laser diode driven by a negative differential resistance (NDR) diode;

FIG. 2 is a graphical representation illustrating simplified current versus voltage curves of the laser diode and the NDR diode;

FIG. 3 is a greatly enlarged simplified sectional view illustrating integration of a laser diode and a NDR diode;

DESCRIPTION OF THE PREFERRED EMBODIMENTS

Figure 4:
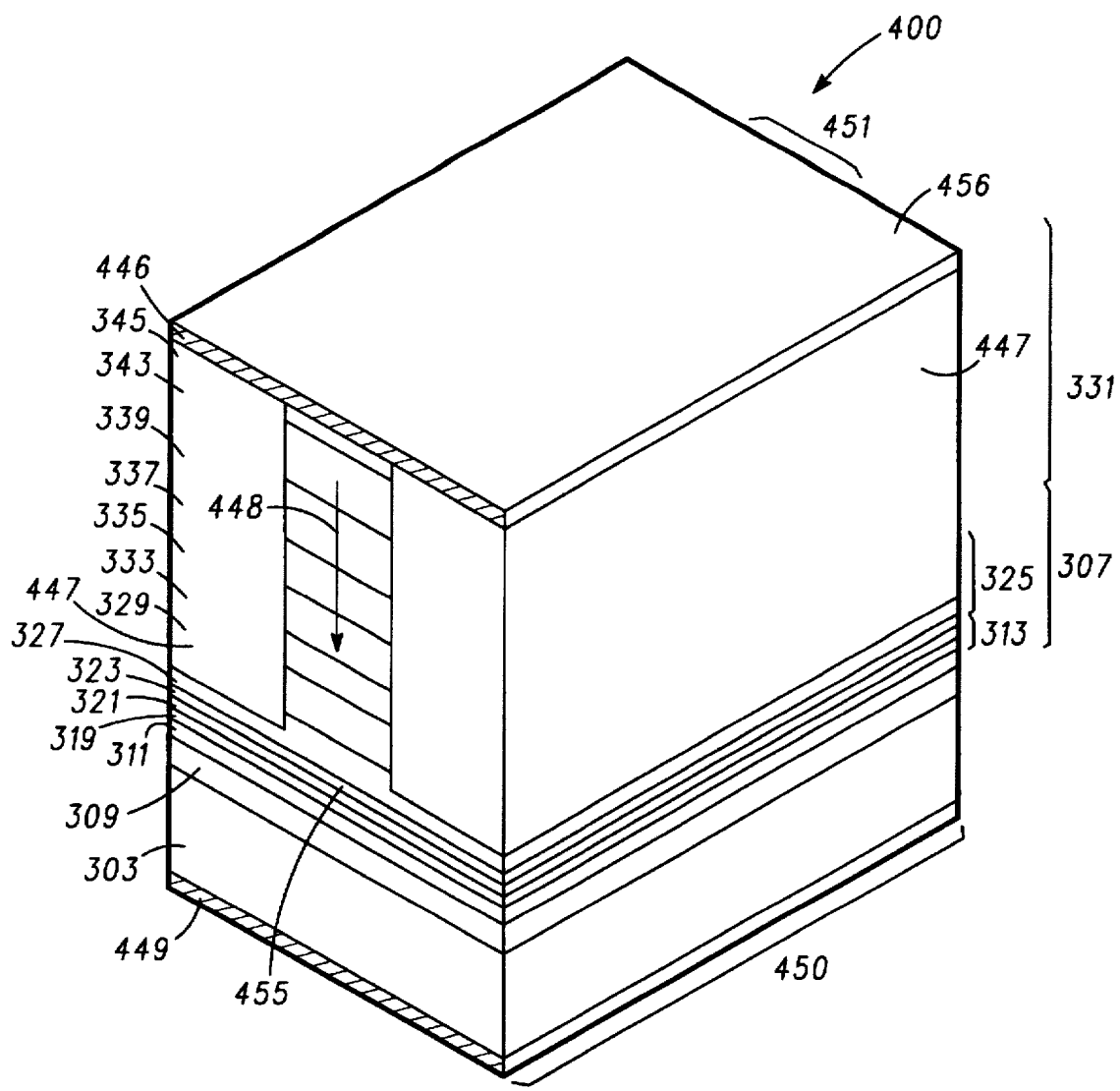
FIG. 4 is a greatly enlarged simplified isometric view illustrating an embodiment of the present invention.

Referring specifically to FIG. 1, a simplified schematic diagram of an integrated device 100 including a negative differential resistance (NDR) diode 103 and a laser diode 113 is illustrated. NDR diode 103 includes electrical contacts 105 and 111 with electrical leads 107 and 109. Laser diode 113 includes an electrical lead 115 connected to lead 109 of NDR diode 103 and an electrical lead 117 connected to a common potential, or ground 119. As shown in FIG. 1, laser diode 113 is electrically coupled to NDR diode 103 by electrical lead 115, thereby placing NDR diode 103 and laser diode 113 in series.

Turning now to FIG. 2, a simplified graphical representation is illustrated depicting responses, or curves 201, in terms of current (I) and voltage (V) of laser diode 113 and NDR diode 103. Current-voltage curves 201 include a first curve 203 depicting the operation of laser diode 13 and a second curve 205 having a negative differential resistance portion 207 between a peak 208 and a valley 210. Curve 205 represents the I–V responses of NDR diode 103 and curve 203 represents the I–V responses of laser diode 113. It should be noted that current-voltage curves 201 illustrate characteristics of NDR diode 103 and laser diode 113 during operation where laser diode 113 is mode locked.

As illustrated in FIG. 2, with an increasing voltage applied to NDR diode 103 through electrical contact 105, current flowing through NDR diode 103 increases to a peak value, as shown by point 208, and then decreases to a valley value, as shown by point 210, and then increases once again, as shown by portion 212 of curve 205. As can be seen from curve 205, portion 207 between the peak value at 208 and the valley value at 210 has a negative differential resistance characteristic. Additionally, as illustrated in FIG. 2, the current-voltage characteristic of laser diode 113, represented by curve 203, is drawn illustrating a load on laser diode 113 by NDR diode 103.

In the present invention, threshold values for laser diode 113 can range from 1 to 300 milliampere (mA), with a preferred range from 10 to 200 mA, with a nominal range from 30 to 100 mA, and a nominal value of 50 mA. A direct current (DC) supply voltage is chosen to intersect between the current-voltage curves 201 of NDR diode 103 and laser diode 113, i.e., setting curve 205 to intersect between points 208 and 210. When NDR diode 103 is biased to operate in the negative differential portion 207 or FIG. 2, NDR diode 103 is unstable and oscillates from the peak value to the valley current. An oscillation frequency of NDR diode 103 is determined by several parameters, such as capacitance, inductance, resistance, and the like of laser diode 113 and NDR diode 103. These parameters are selected such that a specific and desirable oscillation frequency is obtained.

Referring now to FIG. 3, a greatly enlarged simplified sectional view of an integrated device 300 is illustrated. Integrated device 300 includes a laser diode 307 positioned on an NDR diode 331 which is supported by a substrate 303 having surfaces 301 and 305. Laser diode 307 includes, a buffer region 309 positioned on surface 305 of substrate 303, a cladding region 311 positioned on buffer region 309, an active area 313 positioned on cladding region 311, and a cladding region 325 positioned on active area 313. Active area 313 includes a quantum well layer 321 positioned between barrier layers 319 and 323. Cladding region 325 includes layers 327 and 329.

NDR diode 331 includes a cladding region 333 positioned on cladding region 325 of laser diode 307, a tunneling region 335 positioned on cladding region 333, a cladding region 337 positioned on tunneling region 335, a second tunneling region 339 positioned on cladding region 337, a cladding region 343 positioned on tunneling region 339, and a contact region 345 positioned on cladding layer 343.

Substrate 303 is made of any suitable material, such as gallium arsenide (GaAs), gallium phosphide (GaP), or the like. As shown in FIG. 3, surface 305 is used for fabrication of laser diode 307 with NDR diode 331 overlaying laser diode 307. Surface 301 typically is used for providing an electrical contact (e.g. ground 119 of FIG. 1) to laser diode 307 and NDR diode 331 while another electrical contact (e.g. terminal 105 of FIG. 1) typically is supplied by contact region 345. However, it should be understood that other electrical contacts are possible at various points in integrated device 300.

In this particular embodiment of the present invention and throughout the specification, an indium phosphide material based epitaxial structure will be used for laser diode 307 and NDR diode 331. However, it should be understood that other material based systems can be used, such as a gallium arsenide (GaAs) based material system, an indium gallium aluminum phosphide (InGaAlP) based material system, and the like. Also, integrated device 300 is typically fabricated by growing a variety of material layers by any suitable epitaxial growth or deposition technique or method, such as a metal-organic chemical vapor deposition (MOCVD) or molecular beam epitaxy (MBE), or the like.

Generally, epitaxial growth starts with buffer region 309 being epitaxially deposited on surface 305 of substrate 303. In this particular embodiment of the present invention, substrate 303 is made of an n-type indium phosphide material. Buffer region 309 is made of an n-doped indium phosphide material as well which is epitaxially deposited on surface 305 of substrate 303. Thickness of buffer region 309 is not critical, but in practice, it is between 0.1 to 1 micro meters (μm) thick. The n-doped indium phosphide is doped with any suitable n-type dopant, such as sulfur (S), selenium (Se), or the like. Typically, a doping concentration or a doping level ranges between 1e17 to 5e18 centimeters cubed ($cm^{-3}$).

Cladding region 311 is made of n-doped indium gallium arsenide phosphide, e.g., $In_{1-x}Ga_xAs_yP_{1-y}$ with x=0.25, y=0.54. A bandgap of approximately 1 electron Volt (eV) is generated between the conduction band and the valence band, thereby providing efficient carrier confinement. Depending on specific applications, cladding region 311 can be graded by varying both x and y between 0 to 1, thereby altering the bandgap of the cladding, or more specifically, the conduction band difference and the valence band difference between cladding region 311 and the active area 313. A doping concentration or level for cladding region 311 range from 1e17 to 2e18 $cm^{-3}$. Thickness of cladding region 311 range from 500 to 5000 Angstroms (Å) with a preferred range from 1000 to 3000 Å.

While active area 313, in this specific embodiment, includes quantum well layer 321 and barrier layers 319 and 323, it should be understood that quantum well layer 321 can include either an intrinsic single quantum well or multiple quantum wells. Generally, there can be any suitable number of quantum well layers 321; however, in a preferred embodiment of the present invention, the number of quantum well layers range from 1 to 10 with a preferred range from 1 to 4. Quantum well layer 321 is made of any suitable material, such as indium gallium arsenide phosphide (InGaAsP), gallium arsenide (GaAs), or the like. In this particular embodiment of the present invention, quantum well layer 321 is made of an InGaAsP material, e.g., $In_{1-x}Ga_xAs_yP_{1-y}$ with x=0.28, y=0.6, thereby generating light that is emitted from integrated device 300 with a wavelength of approximately 1.3 micrometers (μm). It should be understood that x and y are variable to allow the selection of other desirable wavelengths of light that may be of interest. The thickness of quantum well layer 321 ranges from 30 to 150 Å with a preferred thickness of 100 Å.

Barrier layers 319 and 323 on either side of quantum well layer 321 are made of InGaAsP, e.g., $In_{1-x}Ga_xAs_yP_{1-y}$ with x=0.25, and y=0.54, thereby providing a barrier bandgap of approximately 1 eV. As stated previously with reference to quantum well layer 321, x and y are variable, as long as the material is lattice matched to quantum well layer 321, and the barrier bandgap is larger than a quantum well layer bandgap, thereby tuning the material layers used in active area 313. The thicknesses of barrier layers 319 and 323 range from 50 to 200 Å with a preferred value of 100 Å.

Cladding region 325 of laser diode 307 includes layers 327 and 329 that are epitaxially and sequentially deposited on active area 313. Layer 327 is made of the same material as cladding region 311, i.e., InGaAsP, e.g., $In_{1-x}Ga_xAs_yP_{1-y}$ with x=0.25, and y=0.54; however, layer 327 is p-doped with any suitable p-type dopant, such as zinc (Zn), carbon (C), or the like. The doping level or doping concentration ranges from 1e17 to 2e18 $cm^{-3}$. The thickness of layer 327 ranges from 500 to 5000 Å with preferred range from 1000 Å to 3000 Å. Layer 329 is made of InP with a doping concentration that ranges from 1e18 to 1e19 $cm^{-3}$, thereby providing a p-contact. The thickness of layer 329 ranges from 100 Å to 1 μm with a preferred range from 1000 Å to 3000 Å.

While a only a single doping polarity has been describe hereinabove with reference to laser diode 307, it should be understood that the doping polarity of laser diode 307 can be inverted with p-doped material layers being grown on substrate 303 and an n-doped material layer being grown on active area 313.

NDR diode 331 is epitaxially deposited on laser diode 307 as follows. Cladding region 333 is made of a p-doped indium aluminum arsenide (InAlAs) material that is deposited on layer 329 of laser diode 307. Cladding region 333 is deposited on layer 329 in such a manner as to lattice match layer 329 with cladding region 333, thereby making a lattice matched interface between laser diode 307 and NDR diode 331. The doping concentration or doping level of cladding region 333 ranges from 1e18 to 1e20 cm$^{-3}$ with a preferred range from 5e18 to 5e19 cm$^{-3}$. The thickness of cladding region 333 varies from 100 Å to 5000 Å with a preferred range from 1000 Å to 3000 Å.

Tunneling region 335 includes two or more layers (not shown) which are made of any suitable material, such as GaAs, InGaAs, InAlAs, or the like. In the present embodiment of the present invention, tunneling region 335 includes three layers, one layer made of InGaAs sandwiched between two layers made of InAlAs. Additionally, the three layers are lattice matched to cladding region 333. The thickness of the InGaAs layer ranges from 5 Å to 100 Å with a preferred thickness of 40 Å. The thicknesses of the InAlAs layers range from 5 Å to 100 Å with a preferred thickness of 20 Å. Further, it should be understood that tunneling region 335 can include any suitable number of layers. Generally, the number of layers in tunneling region 335 ranges from 1 to 10 with a preferred number of layers being from 2 to 6.

Cladding region 337 is made of any suitable material, such as GaAs, InGaAs, InAlAs, or the like. However, in this specific embodiment of the present invention, cladding region 337 is made of an InAlAs material that is n-doped. The doping concentration of cladding region 337 ranges from 1e18 cm$^{-3}$ to 1e20 cm$^{-3}$ with a preferred range from 5e18 cm$^{-3}$ to 5e19 cm$^{-3}$. The thickness of cladding region 337 ranges from 100 Å to 5000 Å with a preferred thickness of 2000 Å.

Tunneling region 339, which is deposited on cladding region 337, is made in a fashion similar to that described above for tunneling region 335 and, thus, need not be discussed in detail here. Cladding layer 343 is made of either InAlAs or InGaAs that is p-doped or n-doped, respectively. With layer 343 being made of either InAlAs or InGaAs, doping concentration ranges from 1e18 to 1e20 cm$^{-3}$ and the thickness ranges from 100 Å to 5000 Å with a preferred thickness of 2000 Å. Layer 343 is epitaxially deposited on tunneling region 339 of NDR diode 331, thereby providing lattice matching from tunneling region 339 to layer 343.

Contact layer 345 is made of InGaAsP material, e.g., $In_{1-x}Ga_xAs_yP_{1-y}$, which is highly p-doped. However, it should be understood that if layer 343 is made of InGaAs and n-doped, then layer 345 will be made of InGaAs that is also n-doped. The doping level or concentration level ranges from 1e18 to 1e20 cm$^{-3}$ with a preferred range from 5e18 to 5e19 cm$^{-3}$. The thickness of layer 345 ranges from 50 to 500 Å with a preferred range from 100 to 200 Å.

By integrating laser diode 307 and NDR diode 331 as described hereinabove several advantages are realized, such as being able to fabricate integrated device 300 as a single integrated component, being able to reduce cost, being able to reduce packaging costs, and the like. Also, it should be understood that while the embodiment of the integrated device illustrated in FIG. 3 uses an indium phosphide material base, it will be understood by one of ordinary skill in the art that the same structure can be extended to GaAs material based semiconductor devices.

Referring now to FIG. 4, a greatly enlarged simplified isometric view is illustrated of an embodiment of the present invention showing an integrated device 400. Features or elements used previously with regard to FIG. 3 will retain there original identification numerals for ease of identification. As shown in FIG. 4, integrated device 400 has several new features or elements, such as electrical contacts 446 and 449, damaged region 447, a current path, indicated by arrow 448, a width 451, a round trip laser cavity length 450, and cleaving facets 455 and 456.

Region 447 illustrates a region in integrated device 400 that confines current to current path 448. Region 447 is generated by either damaging region 447 or removing region 447. For example, region 447 can be made by implanting ions, such as hydrogen (H), oxygen (O), or the like into region 447 that will physically damage the crystal lattice structure in region 447, thereby generating a damaged region. Alternatively, region 447 can be etch away or removed from integrated device 400, thereby confining current to a current path indicated by arrow 448.

Width 451 is defined by region 447 as shown in FIG. 4 which defines electrical working portions of NDR diode 331. Width 451 can be made to any suitable width; however, in a preferred embodiment, width 451 ranges from 1 to 10 μm.

Electrical contact 446 is made of any suitable material, such as gold (Au), titanium/gold (TiAu), titanium/tungsten (TiW), aluminum (Al) or the like that makes an Ohmic contact to layer 345. It should be understood that a general purpose of electrical contact 446 is to make a contact having a low contact resistance. Electrical contact 449 is made of any suitable material, such as Au, nickel/gold (NiAu), geranium/gold (GeAu), Al, or the like that makes an Ohmic contact to substrate 303. Here, as with electrical contact 446, the general purpose is to make a contact with the smaller contact resistance possible.

The round trip laser cavity length 450 is determined by cleaving facets 455 and 456 of integrated device 400. Typically, the laser cavity length ranges from 50 μm to 1 mm with a preferred range from 150 μm to 500 μm. When a voltage source having a current, specified with reference to FIG. 2, is applied to electrical contacts 446 and 449 of integrated device 400, an electrical pulse train having a high repetition rate is generated by NDR diode 331. The electrical pulse train is applied to laser diode 307 through the current path 448. When the current exceeds the threshold current of laser diode 307, laser diode 307 oscillates and emits light from facets 455 and 456.

Additionally, in some applications, it is advantageous to make facet 455 highly reflective (HR). Facet 455 is made HR by coating facet 455 with a highly reflective coating, such as a silicon dioxide ($SiO_2$) coating, a silicon (Si) coating, or the like, thereby reflecting some of the light emitted from integrated device 400 to facet 456 and providing a strong feedback. Alternatively, an antireflective (AR) coating can be applied to facet 455 to reduce feedback and thereby increase output power from facet 456.

In operation, active mode locking is achieved by tuning the voltage source so that the electrical pulse train has a repetition rate matching round trip laser cavity length 450. With the matching of the voltage source to the laser round trip cavity length, laser diode 307 pulses and emits light in a picosecond time frame. In order to generate a mode locked laser with a repetition rate slower than round trip laser cavity length 450, an external cavity with a coupling lens mounted in front of facet 455 that has been coated with an antireflective coating can be constructed. An output mirror is positioned behind the coupling lens, and the distance between the output mirror and the facet 455 is adjustable, thereby enabling adjustment of the repetition rate. Thus, it is possible to generate light pulse from laser diode 307 having a pulsewidth on the order of picoseconds with a repetition rate varying from 100 MHz to 500 GHz.

Figure 5:
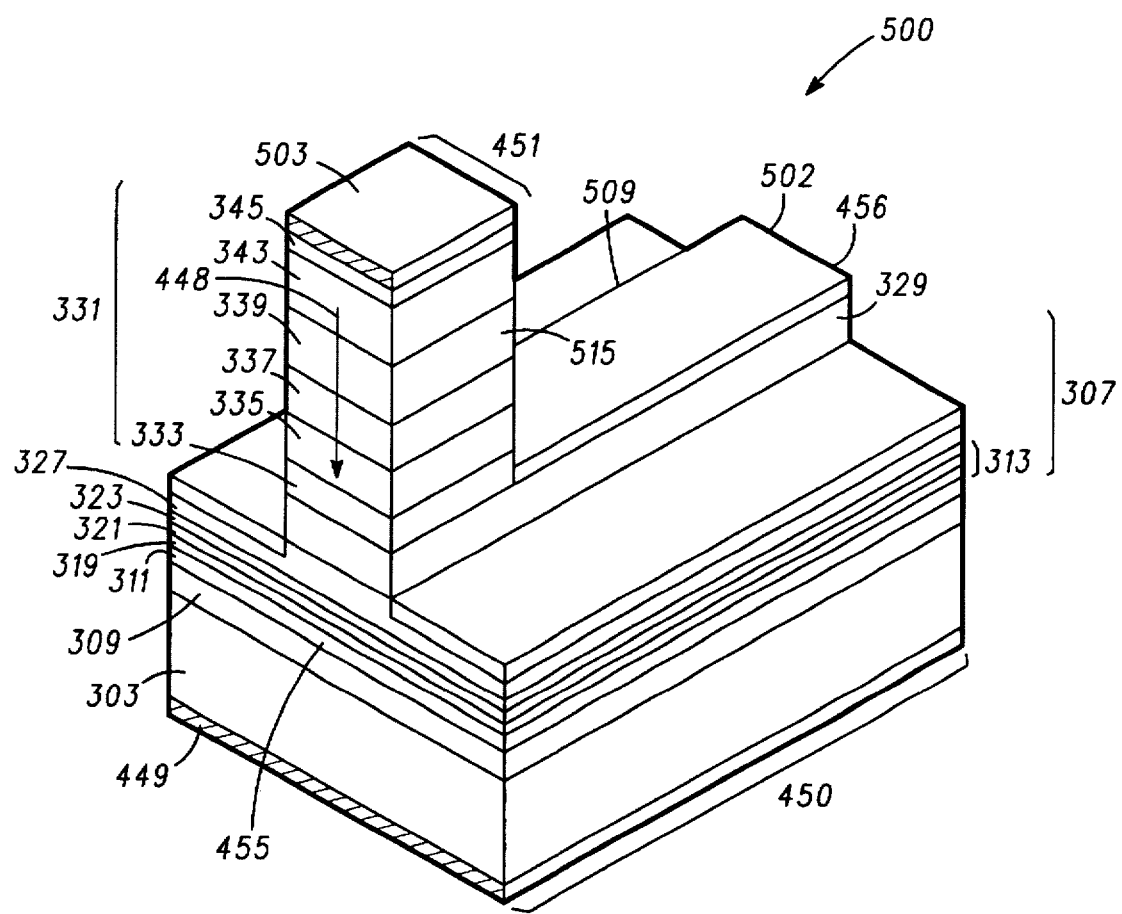
FIG. 5 is a greatly enlarged simplified isometric view illustrating another embodiment of the present invention.

Referring now to FIG. 5, a greatly enlarged simplified isometric view is illustrated of another embodiment of the present invention showing an integrated device 500. Features or elements used previously with regard to FIGS. 3 and 4 will retain there original identification numerals for ease of identification. As shown in FIG. 5, integrated device 500 has several new features or elements, such as current blocking layer 501, mesa ridge 509 and 515, electrical contacts 502 and 503.

Generally, integrated device 500 is fabricated by etching mesa ridge 509 into integrated device 500. It should be understood that etching away or removing those portions previously referred to as damaged region 407 in FIG. 4 results in mesa ridge 509 that extends from facet 455 to facet 456. Etching of integrated device 500 is performed by any well-known methods in the art, such as wet etching or dry etching, e.g., plasma etching or the like. The etching of integrated device 500 to form mesa ridge 509 that extends from facet 455 to 456 is continued until layer 327 of laser diode 307 is reached. Current blocking layer 501 is then deposited on exposed portions of layer 327, thereby insulating the exposed portions of layer 327. Blocking layer 501 is made of any suitable insulating material, such as silicon nitride (SiN), silicon dioxide ($SiO_2$), oxynitride (SiNO), or the like.

In a separate etching step, a portion of mesa ridge 509 that extends from facet 455 to facet 456 is partially removed, thereby making mesa ridge 515. Etching of mesa ridge 515 is continued until layer 329 is reached. Once the etching to form mesa ridge 515 is completed, mesa ridge 509 and mesa ridge 515 are fully formed and ready for subsequent processing. Once mesa ridges 509 and 515 have been formed, electrical contacts 502 and 503 are formed on mesa ridges 509 and 515. Electrical contacts 502 and 503 are made of any suitable metal material, such as Au, zinc/gold (ZnAu), TiAu, chromium/gold (CrAu) that forms an Ohmic contact to layer 329 or 345.

Electrical contact 502 is use to provide a DC current to directly bias laser diode 307 and thereby bypass NDR diode 331, which is positioned in the ridge 515. Electrical contact 449 provides a second electrical contact for laser diode 307. Electrical contact 449 is made of the same material as previously described with reference to electrical contact 449 in FIG. 4.

A voltage source is applied between electrical contact 503 and electrical contact 449 to generate an electrical pulse train with high repetition rate, and this pulse train in return is biased on laser diode 307 to modulate the laser operation on top of the DC current source biased between electrical contacts 502 and 449. In the present invention, the electrical pulse train from the NDR diode 331 only needs to be strong enough for modulation purposes because laser diode 307 is mostly driven by the DC current source applied between electrical contacts 502 and 449.

Active mode locking is achieved when the modulation repetition rate from an electrical pulse train matches round trip laser cavity length 450. The picosecond laser pulses with a repetition rate of the electrical pulse train is therefore generated from the laser. Sometimes, in order to generate mode locked lasers with a repetition rate slower than the laser cavity round trip length, an external cavity can be assembled with a coupling lens placed in front of the AR coated facet 455, and an output mirror placed behind the lens with a varying distance to adjust the required repetition rate. The other facet 456 is highly reflectively coated for stronger light feedback, or less light coupling loss. In this way, it is possible to generate the picosecond laser pulse source with a repetition rate varying from 100 MHz to 500 GHz.

Additionally, electrical contact 502 can be made into two sections, with the section closer to the ridge 515 biased by the positive current source, and the section closer to the facet 456 slightly reverse biased or without bias. In this way, a saturable absorption region is created for hybrid mode locking. Subpicosecond pulses can therefore be generated with little timing jitter due to the active control of NDR.

It should be appreciated that a novel integrated laser diode and an NDR diode have been disclosed and a novel fabrication method has been provided. By integration of the laser diode to the NDR diode several advantages result, such as extremely small pulse widths at a high repetition rate that can be modulated by extremely small signal strengths. Additionally, since the laser diode and the NDR diode are integrated in a continuous process flow, the integrated device is highly manufacturable, thus reducing overall costs and allowing significant improvements in reliability and quality.

While we have shown and described a specific embodiment of the present invention, further modification and improvement will occur to those skilled in the art. We desire it to be understood, therefore, that this invention is not limited to the particular forms shown and we intend in the appended claims to cover all modification that do not depart from the spirit and scope of this invention.

What is claimed is:

1. A mode locked laser with a negative differential resistance diode comprising:
   a negative differential resistance diode having a first electrical contact and a second electrical contact; and
   a laser diode having a third electrical contact and a fourth electrical contact, wherein the second electrical contact of the negative differential resistance diode is electrically coupled with the third electrical contact of the laser diode and wherein the negative differential resistance diode and the laser diode are integrated into a single monolithic device.

2. A mode locked laser with a negative differential resistance diode as claimed in claim 1 further comprising a voltage source having a positive electrical contact and a negative electrical contact, wherein the positive electrical contact of the voltage source is electrically coupled to the first electrical contact, thereby electrically coupling the negative differential resistance diode to the voltage source.

3. A mode locked laser with a negative differential resistance diode as claimed in claim 2 further including a ground, wherein the negative electrical contact and the fourth electrical contact are electrically coupled to the ground.

4. A mode locked laser with a negative differential resistance diode as claimed in claim 1 wherein the laser diode is a vertical cavity surface emitting laser.

5. A mode locked laser with a negative differential resistance diode as claimed in claim 1 wherein the laser diode is an edge emitting laser.

6. A mode locked laser with a negative differential resistance diode comprising:

a negative differential resistance diode including a first electrical contact, a tunneling region, and a first cladding region, wherein the tunneling region is disposed between the first electrical contact and the first cladding region; and a laser diode having a second cladding region, an active area, and a third cladding region and a second electrical contact, wherein the active area is positioned between the second cladding region and the third cladding region and wherein the first cladding region of the negative differential resistance diode is electrically coupled with the second cladding region of the laser diode.

7. A mode locked laser with a negative differential resistance diode as claimed in claim 6 further including a voltage source having a positive electrical contact, a negative electrical contact, and a voltage, wherein the positive electrical contact of the voltage source is electrically coupled to the first electrical contact, thereby electrically coupling the negative differential resistance diode to the voltage source.

8. A mode locked laser with a negative differential resistance diode as claimed in claim 7 wherein the voltage is in a range from 0.1 to 5.0 volts.

9. A mode locked laser with a negative differential resistance diode as claimed in claim 7 wherein the voltage is in a range from 0.5 to 3.0 volts.

10. A mode locked laser with a negative differential resistance diode as claimed in claim 7 further including a ground, wherein the negative electrical contact of the voltage source and the second electrical contact of the laser diode are electrically coupled to the ground.

11. A method for making an integrated negative differential resistance diode and a laser diode comprising the steps of:

providing a substrate having a first surface and a second surface;

forming a laser diode having a first cladding region, an active area, and a second cladding region, the first cladding region being disposed on the first surface of the substrate, the active area being disposed on the first cladding region, and the second cladding region being disposed on the active area; and forming a negative differential resistance diode having a third cladding region, a tunneling region, and a fourth cladding region, the third cladding region being disposed on the second cladding region with the second cladding region and the third cladding region being latticed matched, the tunneling region being disposed on the third cladding region, and the fourth cladding region being disposed on the tunneling region, thereby integrating the laser diode and the negative differential resistance diode.

12. A method for making an integrated negative differential resistance diode and a laser diode as claimed in claim 11 where, in the step of forming a negative differential resistance diode, the negative differential resistance diode is epitaxially disposed.

13. A method for making an integrated negative differential resistance diode and a laser diode as claimed in claim 11 where, in the step of forming the laser diode, the laser diode is formed by epitaxial deposition.

14. A method for making an integrated negative differential resistance diode and a laser diode as claimed in claim 11 where, in the step of forming the negative differential resistance diode, the negative differential resistance diode is formed by epitaxial deposition.

15. A method for active mode locking of a laser diode comprising the steps of:

forming a negative differential resistance diode having a first electrical contact, a first cladding region, a tunneling region, and a second cladding region with the negative differential resistance diode generating an electrical pulse train having a repetition rate; and forming a laser diode having an active area with a round trip laser cavity length, a third cladding region, a fourth cladding region, the active area, the second cladding region of the negative differential resistance diode and the third cladding region of the laser diode are electrically coupled and latticed matched, and wherein the electrical pulse train generated by the negative differential resistance diode is imposed on the laser diode through the second cladding region of the negative differential resistance diode and the third cladding region of the laser diode, thereby causing a light to be emitted and modulated by an interaction between the laser diode and the negative differential resistance diode.

16. A method for active mode locking of a laser diode as claimed in claim 15 where, in the step of forming a laser diode having an active area with a round trip laser cavity length, a third cladding region, and a fourth cladding region, the electrical pulse train is adjusted to match the round trip laser cavity length of the laser diode.

* * * * *